(12) United States Patent
Patel et al.

(10) Patent No.: US 6,687,562 B2
(45) Date of Patent: Feb. 3, 2004

(54) PROCESS MONITORING SYSTEM FOR LITHOGRAPHY LASERS

(75) Inventors: Parthiv S. Patel, San Diego, CA (US); Joseph E. Conway, El Cajon, CA (US); Muljadi Tantra, Pleasanton, CA (US); Jeffrey W. Moen, Oceanside, CA (US); Jason R. Carlesi, Ramona, CA (US); Roger L. Green, Escondido, CA (US); Tom A. Watson, Carlsbad, CA (US); Christopher G. Rowan, Coronado, CA (US)

(73) Assignee: Cymer, Inc., San Diego, CA (US)

( * ) Notice: Subject to any disclaimer, the term of this patent is extended or adjusted under 35 U.S.C. 154(b) by 513 days.

(21) Appl. No.: 09/733,194

(22) Filed: Dec. 8, 2000

(65) Prior Publication Data

US 2001/0020195 A1 Sep. 6, 2001

Related U.S. Application Data

(63) Continuation-in-part of application No. 09/505,233, filed on Feb. 16, 2000, now Pat. No. 6,408,260.

(51) Int. Cl.[7] .............................................. G06F 19/00
(52) U.S. Cl. ........................... 700/121; 700/9; 702/188
(58) Field of Search ........................... 700/9, 2, 3, 108, 700/121; 702/188, 182, 183, 184; 438/14, 16, 17

(56) References Cited

U.S. PATENT DOCUMENTS

| | | | | |
|---|---|---|---|---|
| 5,764,505 A | * | 6/1998 | Mixon et al. ................. 700/2 |
| 5,779,799 A | * | 7/1998 | Davis ......................... 118/663 |
| 5,805,442 A | * | 9/1998 | Crater et al. .................... 700/9 |
| 5,978,406 A | | 11/1999 | Rokni et al. ................... 372/58 |
| 5,982,800 A | | 11/1999 | Ishihara et al. ................ 372/57 |
| 5,991,324 A | | 11/1999 | Knowles et al. ............... 372/57 |
| 6,008,497 A | * | 12/1999 | Mizoguchi et al. ....... 250/492.1 |
| 6,014,398 A | | 1/2000 | Hofmann et al. .............. 372/60 |
| 6,038,486 A | * | 3/2000 | Saitoh et al. .................... 700/9 |
| 6,061,603 A | * | 5/2000 | Papadopoulos et al. ........ 700/83 |
| 6,128,323 A | | 10/2000 | Myers et al. ............... 372/38.1 |
| 6,188,710 B1 | | 2/2001 | Besaucele et al. ............. 372/60 |
| 6,192,291 B1 | * | 2/2001 | Kwon ......................... 700/121 |
| 6,199,018 B1 | * | 3/2001 | Quist et al. .................. 702/181 |
| 6,201,996 B1 | * | 3/2001 | Crater et al. .................... 700/9 |
| 6,233,492 B1 | * | 5/2001 | Nakamura et al. .............. 700/2 |
| 6,408,260 B1 | * | 6/2002 | Watts et al. ................. 702/188 |
| 6,522,674 B1 | * | 2/2003 | Niwano et al. ................ 372/30 |
| 6,564,171 B1 | * | 5/2003 | Peterson et al. ............. 702/183 |

\* cited by examiner

Primary Examiner—Emanuel Todd Voeltz
Assistant Examiner—Edward F Garn, Jr.
(74) Attorney, Agent, or Firm—William Cray

(57) ABSTRACT

A system for a monitoring lithography lasers at integrated circuit fabrication plants. Each laser at each fabrication plant has associated with it a terminal server. With respect to each fabrication plant a central control server unit is in communication with each of the lasers through a local area network. Information from the lasers is collected by the central control server unit and the information is used to provide summary information which is made available in a web site format to interested parties having access authorization.

14 Claims, 5 Drawing Sheets

PROCESS MONITORING SYSTEM FOR LITHOGRAPHY LASERS

This application is a continuation-in-part of Ser. No. 09/505,233, U.S. Pat. No. 6,408,260 filed Feb. 16, 2000. The present invention relates to monitoring systems and in particular to monitoring systems for lasers.

BACKGROUND OF THE INVENTION

The fabrication of integrated circuits is typically accomplished using a lithographic process in which a stepper or scanner machine is used to print integrated circuits on silicon wafers. In state of the art fabrication plants, the light sources for this lithographic process are excimer lasers, most of which are narrow band KrF excimer lasers operating at a wavelength of about 248 nm. In the future, greater resolution, than is possible with the 248 nm wavelength light will be provided by an industry shift to ArF excimer lasers operating at about 193 nm and $F_2$ excimer lasers operating at about 152 nm.

Since the fabrication lines including the stepper/scanner machines and their associated laser light sources are very expensive and the integrated circuits they produce are very valuable, the integrated circuit fabrication lines typically operate almost continuously, "round the clock", 24 hours a day, 7 days per week 365 days per year with the minimum possible down time for maintenance. Therefore, great efforts go into building and servicing the fabrication line equipment, including the excimer lasers, to minimize down time, especially unscheduled down time. As a result, lithography excimer lasers are expected to have "down time" of much less than 1%.

In addition, the quality of the integrated circuits produced on these fabrication lines is to a large extent dependent on the quality of the laser beam produced by the laser The beam as indicated above is typically line narrowed and the energy of each pulse is carefully controlled. Beam quality specification parameters of centerline wavelength, bandwidth and pulse energy are typically monitored for each pulse which in state of the art lithography lasers operate at pulse rates of between 1,000 and 2,500 pulses per second. Beam specifications for a typical KrF excimer laser might be:

| | |
|---|---|
| Wavelength variation (within a 30 pulse window) = | ±0.07 pm |
| Wavelength sigma (i.e., standard deviation) = | ±0.06 pm |
| Bandwidth (less than) = | 0.6 pm |
| Dose variation (within a 30 pulse window) = | 0.4 percent |
| Energy Sigma (within a 30 pulse window) = | 12 percent |
| Energy Variation (within a 30 pulse window) = | 7.5 percent |

These specifications are examples of the type of quality standards which are applied to determine if a laser's performance passes an acceptance test prior to shipment from the laser fabrication plant.

During operation of the integrated circuit fabrication line, energy, center wavelength, and bandwidth are monitored and energy and centerline wavelength are controlled with automatic computer based feedback controls. Various methods are used by the operators of the fabrication lines to control the quality of the laser beam and to make decisions as to when adjustments, maintenance or equipment replacement is necessary. These decisions are often difficult to make when beam quality deteriorates because shutting down a production line for repairs usually involves production losses which increase unit production costs of the integrated circuits. On the other hand, continuing to produce with less than ideal beam quality results in reduced quality.

U.S. Pat. No. 5,646,954 (incorporated herein by reference) describes a prior art maintenance strategy control system and monitoring method for improving performance reliability of excimer laser lithography light sources. This system uses microprocessors to monitor laser pulses and to predict based on usage values when maintenance and equipment replacement should be scheduled. Lithography lasers are typically built in modular form so that an entire module is quickly replaced with a spare module whenever there is a failure within the module. The replaced module is then returned to the factory. The reusable parts in it are recycled into newly manufactured modules. Examples of such modules include chamber modules comprising the laser chamber and associated components, stabilization modules comprising a wavemeter for stabilizing the wavelength and pulse energy of the laser beam and a line narrowing module (LNM) for narrowing the bandwidth of the laser beam and controlling the wavelength of the beam.

Control of laser beam quality is very important to maintaining high quality integrated circuit production. State of the art lithography lasers such as KrF excimer lasers comprise three information control-data ports:

(1) a stepper/scanner port through which the stepper/scanner computer controller issues firing commands to the laser computer.

(2) a serial port for a laser control device in the shape of a paddle and called a paddle through which laser operators send serial commands to the laser to control laser parameters such as target wavelength, pulse energy or makes adjustments to parameters such as gas mixtures.

(3) An RS-232 diagnostic port used by field engineers to collect parametric data from the laser computer.

A typical current process for collecting and processing data from lithography lasers by the laser manufacturer involve the following steps:

a) Field engineers from the laser manufacturer physically download the data from the lithography lasers every week b) This data is stored in the form of ASCll flat files and then sent by E-mail to laser manufacturer for further processing.

c) This E-mail based program has been in use for 3 years, which parses data files of E-mails and saves them in a server.

d) This data is viewed/massaged by experienced factory technical support personnel for discrepancy.

e) Ad-hoc queries are generated by user(s) based on the data in SQL Server Database for historical analysis.

f) The entire process is time sensitive (e.g. certain queries take between 7 to 8 minutes for processing).

The following limitations exist since the current process is manual in nature:

a) Field engineers must be physically present in the clean room environment at the integrated circuit fabrication plant to download this data every week. Hence, this process cannot be done daily but has to be scheduled with the customer/field engineers. The data currently is being collected every week.

b) The data is not real time in any nature and by the time it is processed the data may be more than a week old.

c) There is no continuous status reporting.

d) Training of field engineers to download the data in proper format is necessary.

e) There are no automatic alerts to concerned personnel.

f) The entire process has a degree of uncertainty in operating these laser machines and represents substantial overhead cost to both the laser supplier and the fabrication plant.

What is needed is a better system for monitoring lithography lasers.

SUMMARY OF THE INVENTION

The present invention provides a system for a monitoring lithography lasers at integrated circuit fabrication plants. Each laser at each fabrication plant has associated with it a terminal server. With respect to each fabrication plant a central control server unit is in communication with each of the lasers through a local area network. Information from the lasers is collected by the central control server unit and the information is used to provide summary information which is made available in a web site format to interested parties having access authorization.

A principal function of the present invention is data acquistion. Monitors on the lasers record an enormous amount of data. For example, each laser pulse is monitored for pulse energy, wavelength, bandwidth and charging voltage. Since a state of the art laser typically operates at 2000 Hz at duty cycles of about 20 percent, just these parameters represent 1600 values collected each second and since operation is around the clock this data amounts to about 138 million values of primary laser data per day. In addition, the laser calculates other performance values from this primary data. The calculated values include standard deviation values of both wavelength and pulse energy for small groups of data. The laser also calculates a dose variation value for designated groups of pulses referred to as "windows" of pulses. In addition, other laser parameters are monitored very frequently and may be recorded as often as desired. These other parameters include various temperature values, laser gas pressure and fan speed.

Typically the lithography lasers are operated in bursts mode in which short bursts of pulses (such as 200 pulses) are produced (during which time a single dye spot on a wafer is illuminated) followed by an idle time of a fraction of a second during which time the stepper or scanner moves to a different dye spot. After all the dye spots on a wafer are illuminated there is a longer idle time of a few seconds during which time a new wafer is moved into place. The laser monitors this pattern and the present system is capable of documenting each and every pulse of every burst along with the idle times. In addition any desired summaries, compilations, reports, tables which are aggregates or comparisons of the data may be calculated and stored and made available on an almost real-time basis.

Charts could include:

1) For each laser up-time (or down time) on a monthly basis
2) For each laser duty cycle during up-times
3) For each chamber integrated pulse count since last chamber replacement
4) For each module (such as LNP, Power supply module, commutator module, compression lead module, gas module) integrated pulse count (or days) since last module replacement
5) For each laser at specified time intervals: wavelength monitor, wavelength sigma, average bandwidth, dose variation, energy sigma and energy variation.

DETAILED DESCRIPTION OF PREFERRED EMBODIMENTS

First Preferred Embodiment

Figure 1:
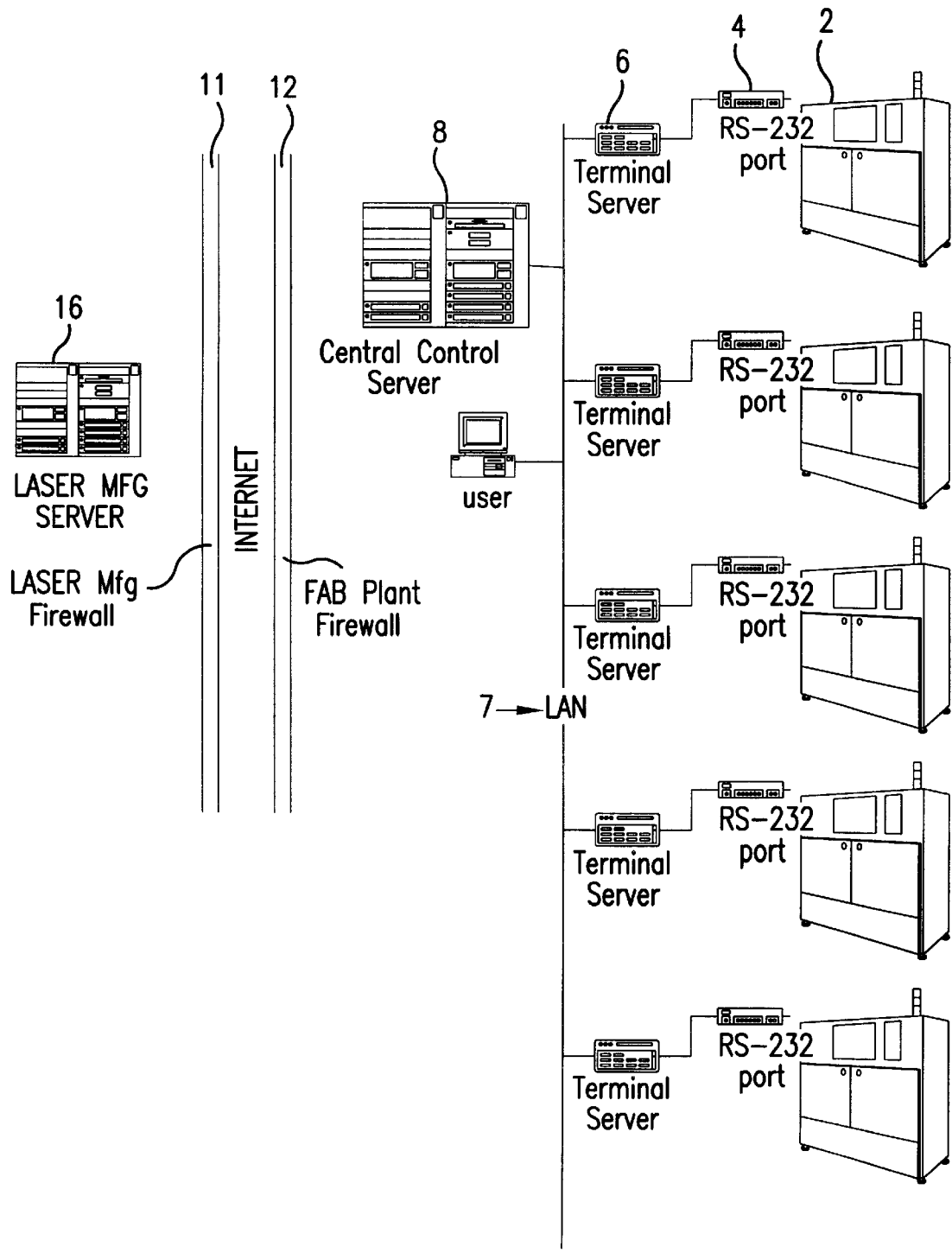
FIG. 1 is a chart showing the general layout of a preferred embodiment of the present invention.

A first preferred embodiment of the present invention can be described by reference to the drawings. A general outline of a process monitoring system for monitoring lithography lasers in integrated circuit fabrication plants is shown in FIG. 1.

Lasers

Lasers 2 in this preferred embodiment are excimer lasers which, in a specific integrated fabrication, may be approximately 20 lasers made up of a combination of models of KrF lasers such as Cymer 5000 series and Cymer 6000 series lasers available from Cymer, Inc. with offices in San Diego, Calif. These lasers operate at repetition rates of about 1000 Hz or 2000 Hz producing laser pulses of about 10 mJ per pulse. These are the ultraviolet light sources for scanner and stepper machines which produce integrated circuits on silicon wafers.

Interface

An RS-232C interface port 4 provides for communication between the laser controls and the monitoring equipment shown in FIG. 1.

Terminal Server

Each laser has associated with it a terminal server 6 having a unique internet address. In the preferred embodiment, the terminal server 6 is a standard server Model LE 995A-R3 available from Blackbox, Inc.

Fabrication Plant Central Control Server

In this preferred embodiment each integrated circuit fabrication plant forming part of the system is served with a single fabrication plant central control server 8. The server 8 communicates with each laser 2 through the fabrication plant's local area network (LAN) 7 as shown in FIG. 1. The preferred minimum requirements for the server are as follows:

Processor: Pentium 700 MHz or higher, dual processor system

RAM: 2 Gb

Hard Disk: 400 Gb

UPS

Backup Tape Drive—400 Gb

A preferred server meeting these requirements would be a server within the HP LH 6000 Series available from Hewlett Packard.

The above system will be sufficient for a fabrication plant where:

a) data is stored for up to 6 months b) the number of lasers are 20 or less.

The Internet

As shown in FIG. 1 in this preferred arrangement the operators of the fabrication plant have erected a fabrication plant firewall 12 between its communication network and the outside world to protect against unauthorized access to the information on its LAN. The laser manufacturer which in this case is responsible for assuring that the lasers 2 comply with agreed upon performance standards and also has contractual obligations with respect to performance of the lasers is permitted limited access to information collected by the monitoring system at the fabrication plant. This limited access is provided (as agreed between the laser manufacturer and the operator of the fabrication plant) through the Internet. However, both organizations have provided firewalls shown as 12 for the fabrication plant and 11 for the manufacturer.

Thus, in a particular preferred embodiment, certain types of data (previously agreed upon) can be stored in server 8 in a web site type format and down loaded by manufacturer through the manufacturer's Internet server 16 to any of several central processing units (not shown) at the manufacturer's facilities.

Control and Monitoring Programs

The central control server 8 in this preferred embodiment utilizes the following commercially available software packages:

a) Operating System—Linux 6.2 Deluxe Version with X11 R6 b) Database Storage and Retrieval—Oracle 8I Standard Edition c) Web Server—Tomcat Version 3.1

Programming

Linux CVS/RCS program is used to program the Linux operating system 8 for this application. A GNU toolset is used to create program libraries which permit the various programs to be modular. Program libraries include: shared libraries, static libraries and dynamically loaded libraries.

Computer Program for Central Control

The software for operating system 8 is preferably created in modular form. There are four primary software modules: the data acquisition module, the parser module, the database module and the user interface module.

The Data Acquisition Module

The data acquisition module consists of a set of programs performing the task of gathering data from lasers 2 and sending the data to the paser module for further processing. The communication is through the terminal server 6 and the RS232C interface 4 as shown in FIG. 1.

The data acquisition module comprises the following software components:

Laser Read and Write

Command Write to Lasers

Command Write Queue

Data Read from Lasers

Master Scheduler

Interface to Parser Program

Database Write Queue

System Error Logs and Error Daemon

Laser Read and Write

The first module consists of socket communication read and writes programs. The write program outputs commands to the laser. The read program acquires the responses and data from the laser. A master scheduler module calls the write program at configurable periodic intervals. The read program is called depending upon the availability of the response data from the device. Each write operation will initiate a data response from the device. The subsequent write operation to the same device should not be attempted before a successful acquisition or a timeout value on the read operation.

Command Write to Device

A socket connection is made from the Linux server to the terminal server. Commands are written to the socket under the control of the master scheduler.

A preferred list of commands to the device is given below:

Get Configuration

The laser control system uses configurable data to customize system operation. For example, the amount of gas during a refill operation, the ages of many laser components, the laser serial number, and many other parameters are included in configuration data. The "get configuration" command collects this information.

Get Diagnostic

Inside the laser, sensors monitor the laser's performance. Periodically, the control module reads the sensors and updates the memory locations that are used to store the sensor readings. The diagnostic readings include parameters such as the temperature inside the laser, and the cooling water flow rate.

Get Errors

When the laser detects warnings or errors, it displays a message on the hand-held terminal, and logs the warning/error code in a section of reserved memory. Each log entry contains the warning or error code number, the date and time that the error occurred, and the parameter that caused the error. The laser stores up to 50 warnings (if you are running MCS version 1.64 or later) and up to 50 errors.

Get Status

Status data are the parameters that determine laser performance, such as repetition rate, energy mode, trigger mode and burst count.

Get Shot data

Every time the laser fires, the following information is saved in the main control board:

Pulse energy

High voltage setpoint

Wavelength

Bandwidth

Get Averaged Shot data 1K

This is shot data averaged over 1000 pulses

Get Averaged Shot data 100K

This is shot data averaged over 100,000 pulses

Get Averaged Shot data 100M

This is slot data averaged over 100,000,000 pulses

Get Fringe Data

Fringe data is a 1024-byte spectral representation of a single laser shot and is used for wavelength calibration. Unlike the other data types, valid fringe data can only be downloaded while the laser is firing.

Get All

This instruction acquires all of the above data. The laser software stores command characters until it encounters a terminating signal. The software then gathers and sends the data to the central control server unit.

Command Write Queue

The master scheduler sends commands to a write queue at a scheduled time. Additionally, an interactive user or another control program can send commands to the command write queue. The write queue uses a first in first out structure and sends the commands to the device using sockets. Commands are issued to a specific laser as designated. The next command to the same laser should not be attempted until the previous command has been completed or a timeout has occurred. Data from the parser is passed to the calling program in an XML format file. The file handler is returned to the calling program by a return message queue. The master scheduler does not need returned data. The returned data is then submitted to a database write queue for uploading of the collected information into the database.

Data Read from Device

Each command sent to each laser results in a response with data from the laser. The subsequent command can be written to the laser after the data response for the previous command has been completely received. If there is no response from the laser, the resulting timeout will terminate the data read program and append an entry to the system error log. Data is read from the terminal server using a socket connection. A form feed denotes the end of each data response. The parser application will handle the entire data response as one dataset. The primary difference here is that only the first data set will have the laser ID. For the purposes of data validation of the data read program, the data is treated as one long string of printable ASCII character. A non-printable ASCII character indicates corrupted data, and that data set will be discarded with an entry to the system error log. Validated data is passed to the parser program in preparation for database loading or web viewing by an interactive user. Other programs that call the write queue module will receive the data in XML format from the parser.

Master Scheduler

This program schedules the various command writes to the laser at previously configured time intervals. Users maintain the command frequency using a User Interface Screen (on the web). The command-write operation to a laser results in a data response. The Linux standard "cron" utility will be used as the master scheduler. A user interface is provided to view and modify the contents of the "crontab" file. A normal user account is used to run these cron jobs.

Interface to the Parser

A laser read program calls the parsing program when it has a complete set of data responding to a command. If the response data is incomplete after a timeout period or is corrupted, it is discarded. If not, the response read from the laser will be stored in a disk buffer.

The parsing program analyzes this data, parse the data per pre-defined grammar and prepare it to load into an Oracle database. The parsing program will then issue a database write request to a database write job queue.

Database Write Queue

Database write requests from the parser are stored in a job queue. Load commands are initiated based on the capabilities of a database SQL loader. The input data rate over a period of time should allow for completion of all the database write requests asynchronously.

A database write submits a job in the batch queue. Commands will be provided to monitor, delete and add new jobs to the batch queue. When a job terminates, the exit value will indicate a success or an error situation. It is possible to use the Linux operating system shell scripts to perform an asynchronous job control of batch jobs. The job to be run in the background under the local shell, and the shell will notify the main program when the job has a change in status. When the queue details program is used in the more traditional batch-processing environment, results are returned to the user via e-mail. These results are redirected to the appropriate success or error log files.

System Error Logs and Error Daemon

The application will create error log entries under the following situations:

No response from device for a command

Incomplete response from device with a timeout

Corrupted response from device

Database load error due to a unique key violation, where data is already available Database load error due to an incorrect load file Database load error due to a database down or other system problems Fatal and non-fatal errors are monitored, and appropriate warnings are displayed in a system console window. A separate system error log daemon may or may not be necessary. Any new fatal or non-fatal error occurrence will trigger alarms and console displays based on the type and the count of errors.

Simulation Program

A simulation program to test the modules described above without tying up a laser is preferably provided. Such a simulation program should simulate device responses to various commands, including incomplete responses, lack of response, and other error conditions. The simulation program preferably runs on a low-power, low-speed PC running Red Hat Linux 6.2. It will be connected to the Black Box Compact Terminal Server (BBTS) using the RS232C interface. The PC stores and simulates all standard responses for each of the possible commands. Initially, flat responses are returned. External application program interfaces will be provided to the Command Write queue and the parser output as described below:

Command Write Queue. This accepts commands from the cron scheduler, an interactive intranet web user or an external program. This queues the commands and writes them to a particular laser, when the last command to that laser has completed. The calling program passes the command, device identifier and the source of the calling program to the command write queue.

Data Read Queue: When data has been read from the laser, it is passed to the parser. The parser splits various fields, inserts timestamp and other headers and prepares the record as outlined in the database schemas. Data read queue contains the file pointer and the return address for the calling programs. The calling program picks up the data through the data read queue.

Database Write Queue: Periodic cron commands will request for data of certain commands to be acquired and be loaded into the database. The output of the parser in SQL Loader format will be presented to the Dbwrite Queue. This queue handles invocation of SQL Loaders and proper loading of data.

Queue Implementation

The following queue mechanisms can be utilized:
1. Linux Shell Queue and GNU Queue Programs 2. TIBCO Queuing Application
3. IBM MQSeries for Linux V5.1 Technology Release

Parser Module

The parser module creates the necessary digital information in the appropriate form so that the data acquired can be properly processed, stored and retrieved. In a preferred arrangement, the information is parsed into 12 categories:

1. header comprising command and laser S/N
2. detail for identifying manufacturer data
3. xml
4. equipment identification
5. data set identification
6. sequence
7. global unique identifier
8. data set date
9. universal time code offset
10. connector type
11. process ID for parser status
12. name of log for warning or error messages

User Interface—Web Pages

The web pages are displayed by constructing HTML pages on the server 8 shown in FIG. 1. Standard HTML tags will be used to create these pages. Since these HTML pages will contain dynamic data that will be retrieved from the database, it is recommended that the Java Server Pages technology (along with servlets) be used. Some of the reasons for selecting this technology are as follows:

1. JSP employs Java and related technology that have become a standard in the industry. Hence it enjoys support from a number of vendors and has good quality of support available. Migrating to future versions will also be easier.
2. Tomcat, which is a JSP and servlets engine is freely available from Apache (http://jakarta.apache.org/tomcat/index.html) and readily integrates with the Apache web server.
3. Future extensions to display the device performance data in hand-held devices can be readily accommodated using the Xalan technology that integrates well with the Apache web server.

Further, Java is a platform independent, secure, network friendly language that employs the "write once, run anywhere" principle. Future migration to a different platform will not require recompilation of any of the front-end code.

In order to support the creation of HTML pages through JSP, Java beans are designed to support the data that needs to be displayed in these pages. There is preferably one Java bean per JSP to load data, perform any data processing and store data back into the database. Proper methods should be identified so that the display and data processing will be correctly separated between the JSP and the Java bean.

In order to access the database to retrieve/store data, JDBC technology is used by the Java bean. There are a number of good pure Java JDBC drivers for Oracle (level 4 drivers) that supply good performance. In addition, the use of prepared statements will enhance performance for frequently executed queries. As specified before, the Java beans contain all the logic for accessing the database. In order to enhance performance even further, these Java beans should obtain connections to the database from the connection pool. The connection pool will recycle connections between various calls to the database thus preventing frequent opening and closing of the connections, which are very expensive. The connection pool will be designed in such a way that its parameters can be externally controlled through a text file. Some of the connection parameters are: number of times a connection can be used, inactive time period after which connection will be returned to the pool, etc. The reader should note that XML pages may be generated instead of HTML pages (from the JSP) so that data can be displayed in various devices (palm pilot, cell phones, browsers, etc.) using the appropriate style sheets.

Web Pages

Web pages that preferably are displayed are:

1. Administration Page—This page will be used to administer the device cluster connected to a particular server. Administration functions will include adding a device to the network, configuring data collection parameters, etc.
2. Central Page—Displays the status of all the lasers that are connected to a particular server.
3. Summary Pages—Displays data regarding a particular laser model. The type of data is either cumulative or averages for that laser model. It also shows the number of parts that are expected to be replaced on a weekly basis for the next 5 months.
4. Equipment Control Pages—Displays data regarding a particular laser ID regarding usage, maintenance and replacement schedules, etc.
5. Service Log Pages—Data is entered by the service personnel for a particular laser ID. The details regarding the down time, parts replaced and comments are entered in this page. This is one of the two pages in the current project which accepts data from the web user to be stored in the database (the other being the Administration page).
6. SPC (Statistical Process Control) Pages—Displays the X-bar and Range charts for various parameters (bandwidth, energy sigma, etc.) for a particular device ID. Also displays the error and warning logs recorded during the past 5 days.
7. Error Pages—Errors and Warnings for a particular device ID.
8. Comments Pages—For each device ID. (drill down from EC)
9. Parts replaced—For each device ID. (drill down from EC)
10. Interactive User Command Page—The user can also issues the laser data acquisition commands like GA, GE, GD, etc. from the browser. This page will have a choice box to select the type of command and a button to submit this command. Once the command is submitted, the raw data that was collected will be displayed in a tabular form.

Additionally, some of these pages should contain tabs to display different types of data. For example, the summary page can be divided into four tabs titled Cost of Consumables, Device Productivity, Device Performance and Replacement Schedules. Dividing a complex page into individual tabs (which will be implemented as separate pages internally) will deliver faster perceived performance since the calculations to render the charts will be divided among the pages.

Web Page Sequence

The home page for the project is provided. The user can drill down to either an individual laser by clicking on the desired device ID area (EC, Service log, etc.) or to the summary page from this page.

There preferably are a number of links from each page to other pages. Also, within the pages that display the details regarding a particular laser ID or in the summary page that displays the data regarding a particular laser model, a different laser ID or model can be chosen from a drop down list box. This event will trigger data for that particular ID(or model) to be displayed.

Currently, all the historical data is displayed for the past 6 months. A future enhancement can provide the user with a choice to select longer time periods (9 months, 1 year, etc.). Perhaps the most important form of displaying data in this project is through the use of charts. The charts must be rendered on the server side and displayed on the browser. In order to achieve this, we can either develop customized charting package or leverage existing charting components from third party vendors. Though developing proprietary charting tools is ideal since it can be customized to our requirements, it can be very time consuming and expensive. A number of vendors supply Java charting components packaged as Java beans. Examples include PowerChart from ProtoView, Jclass components (JCChart) from KL Group, DataVista Pro from Visualize, Inc., (www.visualizeinc.com) etc.

Chart Types

The following are the different types of charts that will be required to be displayed for the project.

1. Bar Charts
2. Stacked Bar Charts (for cumulative data)
3. Line Charts
4. Line Charts with standard deviation (hi-lo) markers
5. Scatter plots The following table shows the preferred charts that may be displayed and their chart types.

| Page | Chart Name | Chart Type | Comments |
|---|---|---|---|
| Summary | Actual Chamber Lifetime | Bar chart | Plot of number of chambers replaced vs. lifetime for a particular laser type |
| | Actual LNM Lifetime | Bar chart | Plot of number of LNM replaced vs. lifetime for a particular type of laser |
| | Actual stabilization Module Lifetime | Bar chart | Plot of number of stabilization modules replaces vs. lifetime for a particular type of laser |
| | Current Month Laser Usage Rate | Bar chart | Plot of usage (Million pulses) vs. number of lasers for a particular laser model |
| | Monthly Average Laser Usage Rate | Line plot | Plot for last 6 months for the average usage rate for a particular laser model. |
| | Monthly Uptime/Downtime | Stacked bar chart | For a particular laser model, percentage of uptime, scheduled and un-scheduled downtimes for the last 6 months. |
| | Monthly Average Bandwidth and 3 Sigma Range | Line Plot with hi/lo points for sigma | Average bandwidth for a particular laser model for the last 6 months. |
| | Monthly Average Energy Stability and 3 Sigma Range | Line Plot with hi/lo for sigma | Average energy stability for a particular laser model for the last 6 months |
| | Errors and Warnings Pareto Chart | Bar chart (with line plot for cumulative?) | Occurances of different types of errors and warnings during the last 6 months. |
| EC | Usage | Line Plot | Usage (billions of pulses) over the last 6 months for a particular laser ID |
| SPC | X-bar | Line Plot with UCL and LCL limit lines | Plots for Bandwidth, Energy Sigma, Dose Error, Voltage, Chamber Pressure, Temperature, Total Injection Shot, F2 Consumption for a particular laser ID. |
| | Range | Line Plot with UCL and LCL limit lines | Same as X-bar |

The tables that need to be displayed are the following:

| Page | Table Title | Row | Column | Data Type |
|---|---|---|---|---|
| Summary | Weekly Parts Replacement Schedule | Part Name | Week (beginning date) | Number of parts to be replaced |
| EC | Estimated Usage Rate (next 5 months) | Part Name | Week (beginning date) | Color coded cell |
| | Scheduled uptime, scheduled/unscheduled downtime | Types of downtimes/uptimes | Times and percentages for the last 3 months and 12 months | Times (hr) and percentages. |
| SPC | Error Log and Warning Log | | | Error/Warning Type and description |

Figure 2:
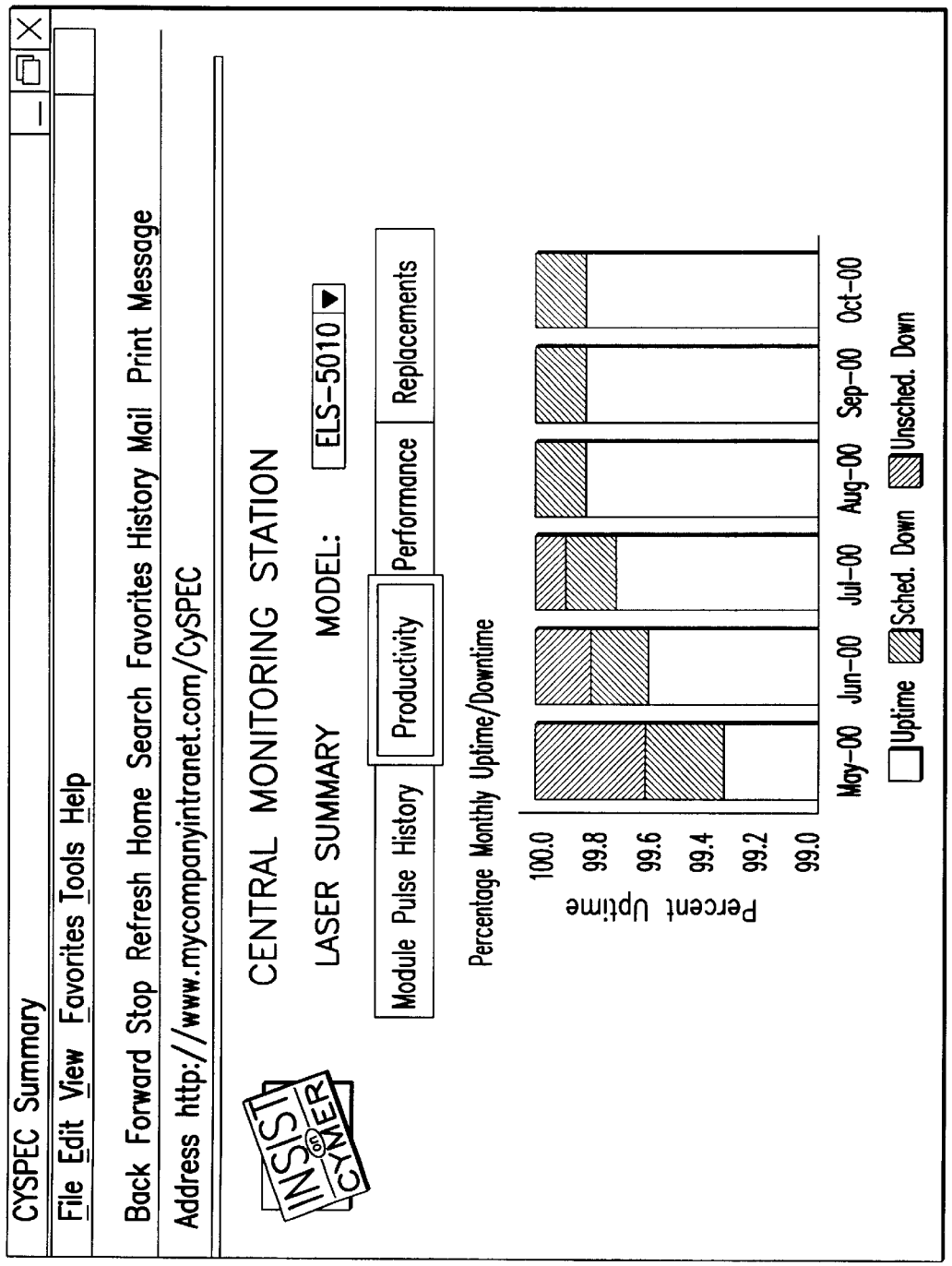
FIGS. 2 through 5 are copies of computer printouts showing the general appearance of typical web pages which were created with a prototype embodiment of the present invention.
Figure 3:
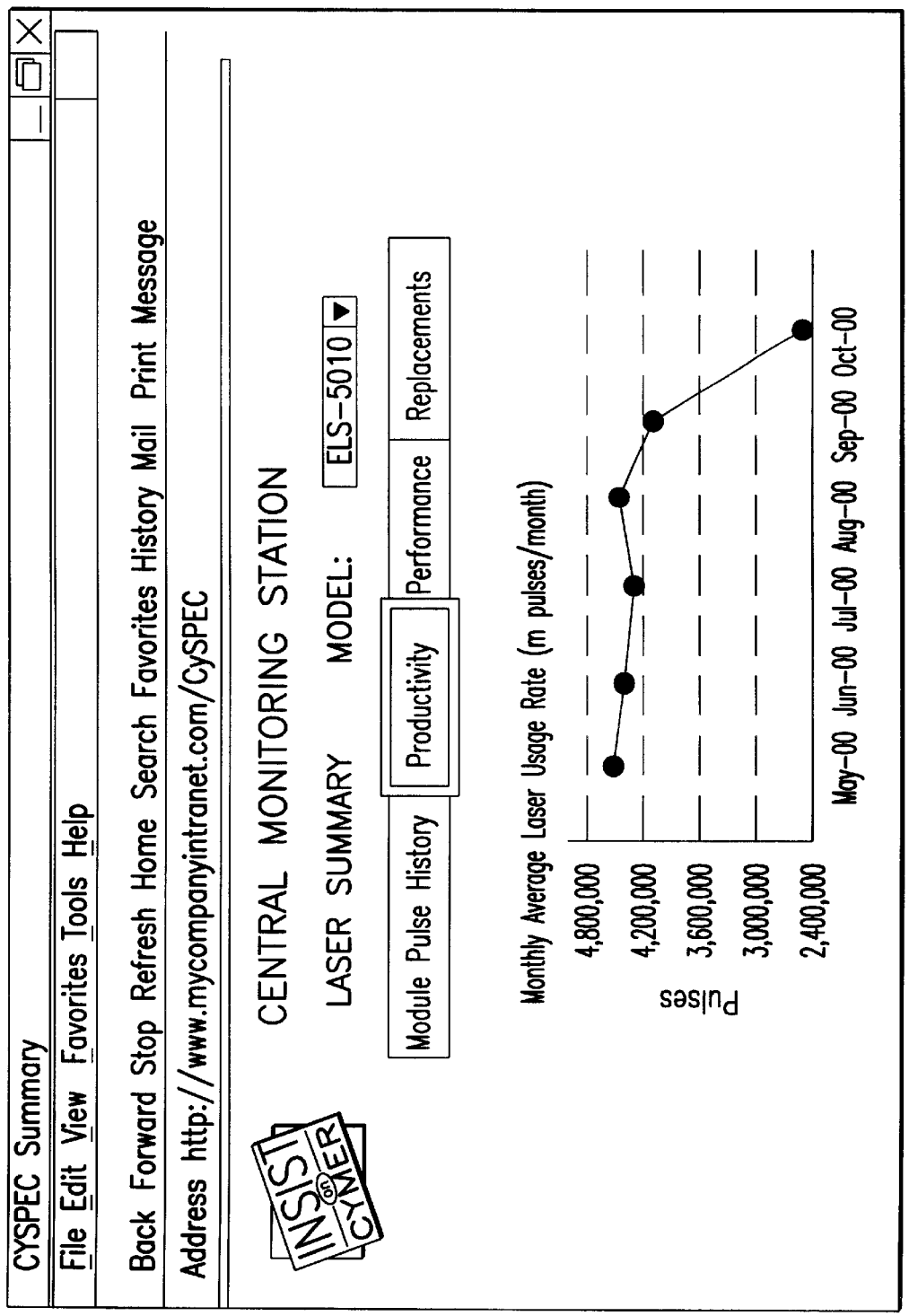
Figure 4:
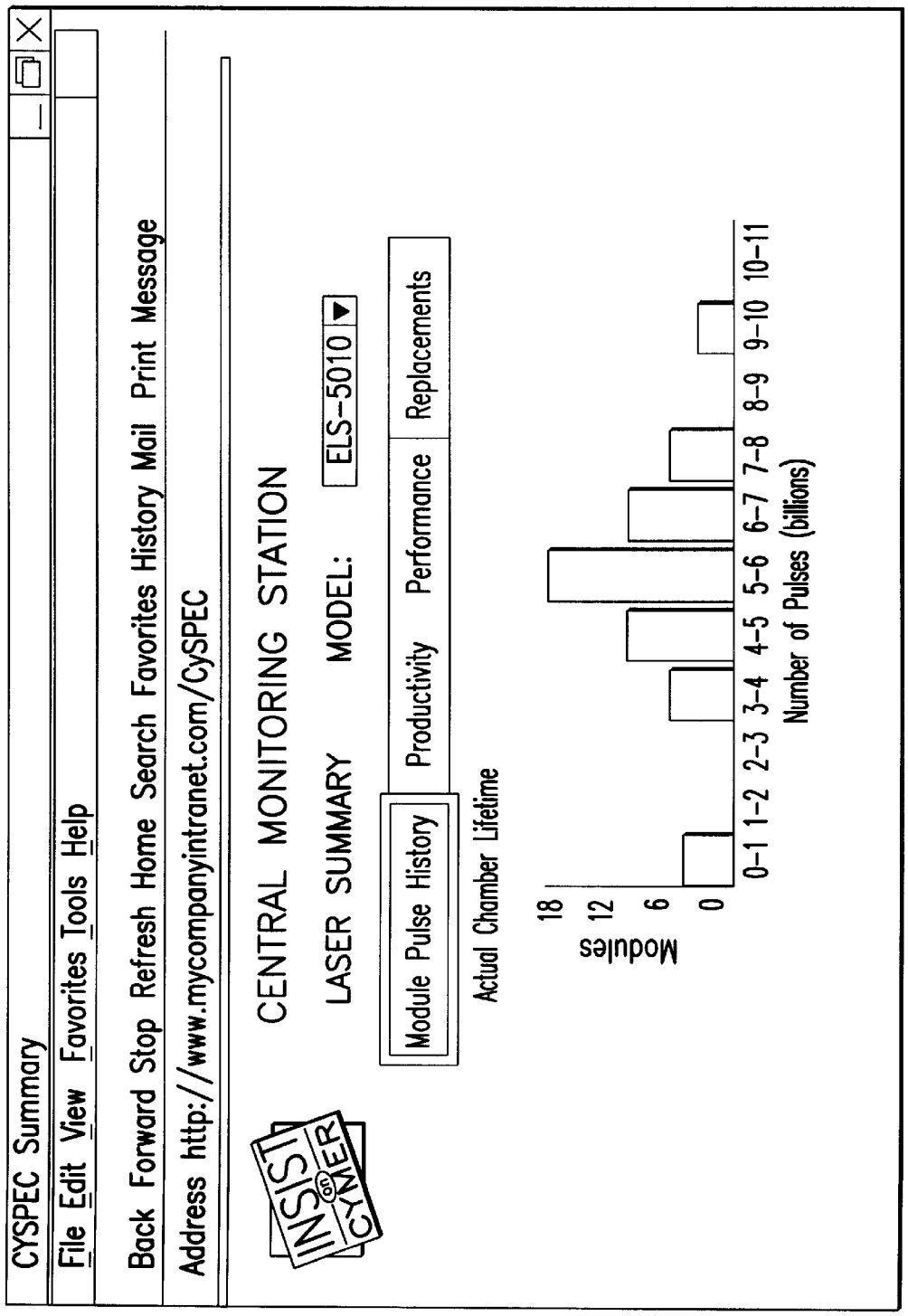
Figure 5:
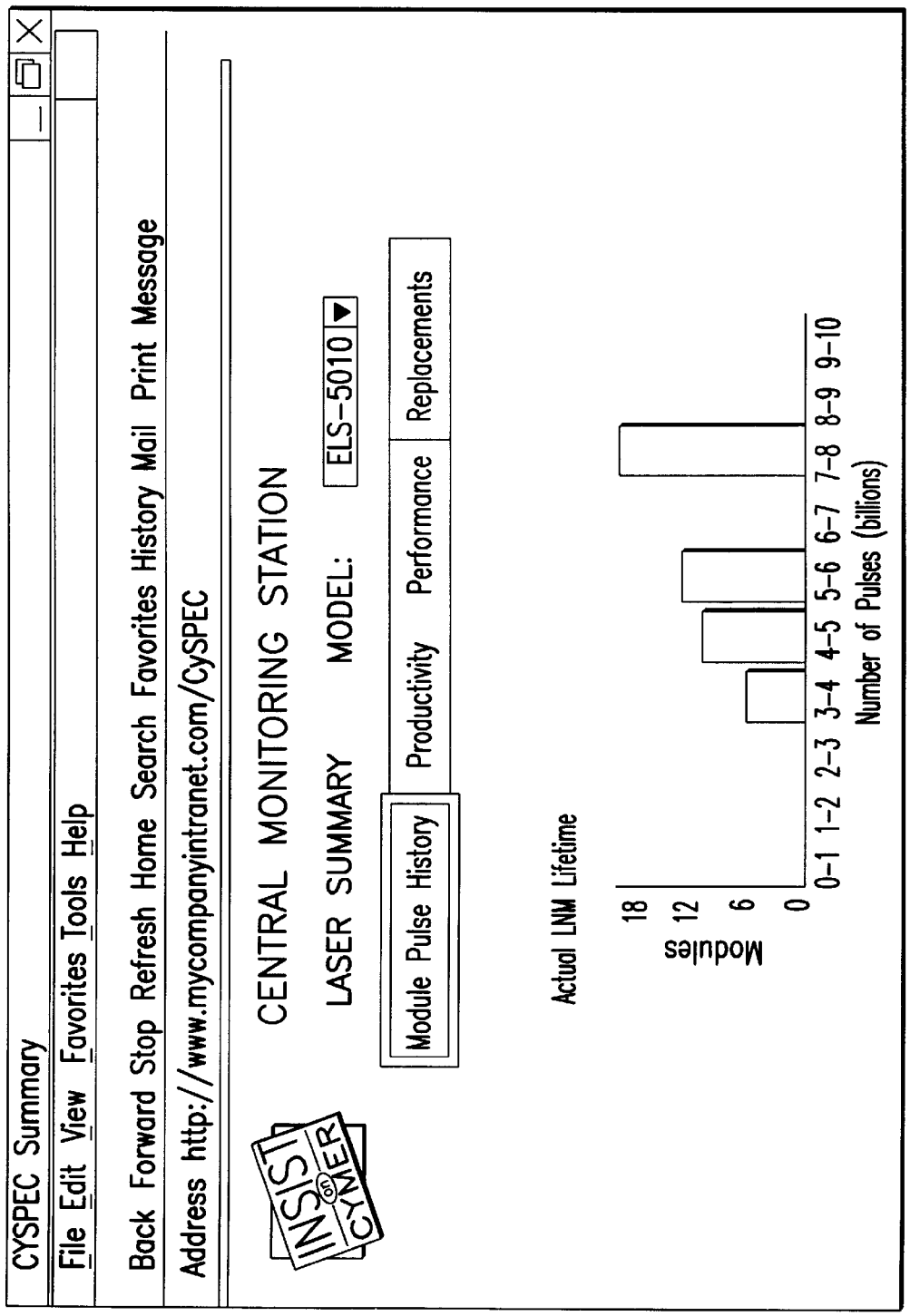

The charts such as those of FIGS. 2 and 3 on charts portraying some or all the information listed above is preferably added to a website created in server 8 and charts are made available through the Internet to interested parties having authorization to access the information. Preferably this is accomplished in the well-known Internet technique requiring a user name and a password.

Thus, this information on web server 8 is available to the laser manufacturer and is used by manufacturer to plan maintenance and replacement activity and to look for trends which could indicate design problems. The information is also available to interested parties outside the fabrication plan but within the corporate organization of the owner of the fabrication plant.

External Interface Specifications

XML format where appropriate are used for communicating with the external applications.

Highlighting Problems and Opportunities

The system described herein permits interested parties to quickly and efficiently compare the performance of a large number of similar lasers. This permits the parties to identify the best and worst performing lasers and to identify problems and recognize techniques and operating parameters which can be applied to improve performance. For example, it is known that the charging voltage needed to produce a desired pulse energy (e.g. 10 mJ) increases as the fluorine concentration decreases at constant chamber gas pressure so that charging voltage (which is monitored for each pulse) is a qualitative measure of fluorine concentration (Actual quantitive measurements of fluorine concentration are not made during operation.) It is therefore possible to operate these lasers over a relatively wide range of charging voltage and fluorine concentration, and it is often not clear to laser operators where the most desirable operating range is. Operating within the best range is important since beam quality parameters vary as a function of fluorine concentration and charging voltage. With this system, comparisons of these beam quality parameters with charging voltage for a large number of lasers over wide ranges of charging voltage may permit interested parties to identify the best range of charging voltage for providing desired beam quality results. Chamber gas pressure can also be adjusted which would also result in a corresponding change in charging voltage or fluorine concentration for the desired constant pulse energy and such an adjustment could improve beam quality.

Also this system will permit the lasers to be programmed to collect laser beam quality data during fluorine gas refills which would permit a determination of beam quality values as a function of quantitive values of fluorine gas concentration, and/or as a function of chamber pressure. This information could be collected from a large number of lasers and would provide additional valuable information which could be used to recommend operating ranges which would produce improved beam quality.

While the invention has been described above with specificity in terms of preferred embodiments, the reader should understand and recognize that many changes and alterations could be made without deviating from the spirit of the invention. Also, in preferred embodiments the laser manufacturer's server 16 is connected through the Internet to many fabrication plants so that hundreds of lasers are monitored. For example, the terminal server 6 shown in FIG. 1 could be a network card embedded in the laser 2, this is referred to as an embedded network card. Therefore, the scope of the invention should be determined by the appended claims and their legal equivalents.

What is claimed is:

1. A system for monitoring lithography lasers at at least one integrated circuit fabrication plant, said system, comprising:
   A) a plurality of lasers each being configured for use as illumination sources in an integrated circuit lithography process,
   B) a terminal server associated with each one of said plurality of lasers;
   C) a central fabrication plant server unit in communication through a local area network with each of said plurality of lasers; said central fabrication plant unit being programmed to acquire data from each of said lasers and to store at least portions of the data in raw form and/or summary form;
   D) a second server unit providing communication through a communication network between said first server unit and computers utilized by persons having access authorization to the information stored by said first server unit.

2. A system as in claim 1 wherein said plurality of lasers are narrow band excimer lasers.

3. A system as in claim 1 wherein each terminal server is provided with a unique internet address.

4. A system as in claim 1 wherein said second server is located at facilities of a laser manufacturer.

5. A system as in claim 1 wherein said central fabrication plant server unit is programmed with software created in modular form said software comprising:
   (a) a data acquisition module
   (b) a parser module
   (c) a database module and
   (d) a user interface module.

6. A system as in claim 5 wherein said data acquisition module comprises software components comprising:
   (a) laser read and write
   (b) command write to lasers
   (c) command write queue
   (d) data read from lasers
   (e) master scheduler
   (f) interface to parser
   (g) database write queue
   (h) system error logs and error daemon.

7. A system as in claim 1 wherein data acquired from said lasers is presented at a web site created by said central fabrication plant server unit.

8. A system as in claim 7 wherein said data acquired from said laser is presented in the form of summary charts.

9. A system as in claim 8 wherein said charts comprise:
   (a) chamber lifetime charts
   (b) LNM charts
   (c) Stabilization module charts
   (d) Uptime or downtime charts
   (e) Maintenance related charts.

10. A system as in claim 7 wherein said web site comprises web pages.

11. A system as in claim 10 wherein said web pages comprise:
   (a) an administration page
   (b) summary pages regarding particular lasers
   (c) service log pages
   (d) error pages.

12. A system as in claim 1 wherein said communication network is the Internet.

13. A system as in claim 1 wherein said communication network is an intranet system.

14. A system as in claim 1 wherein said terminal server is an embedded network card.

* * * * *